United States Patent
Tan et al.

(10) Patent No.: US 10,325,060 B2
(45) Date of Patent: Jun. 18, 2019

(54) HOTSPOT CORRECTION METHOD

(71) Applicant: SHANGHAI HUALI MICROELECTRONICS CORPORATION, Shanghai (CN)

(72) Inventors: Yiqun Tan, Shanghai (CN); Shirui Yu, Shanghai (CN); Xuan Zhao, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 83 days.

(21) Appl. No.: 15/826,705

(22) Filed: Nov. 30, 2017

(65) Prior Publication Data
US 2019/0102507 A1  Apr. 4, 2019

(30) Foreign Application Priority Data
Sep. 30, 2017  (CN) .......................... 2017 1 0924604

(51) Int. Cl.
G06F 17/50 (2006.01)
G03F 1/36 (2012.01)

(52) U.S. Cl.
CPC ............ *G06F 17/5081* (2013.01); *G03F 1/36* (2013.01)

(58) Field of Classification Search
CPC ..... G03F 1/36; G03F 1/44; G03F 1/72; G03F 7/70441; G03F 7/70443; G06F 17/5068; G06F 17/5081
USPC ....................................................... 716/53, 55
See application file for complete search history.

(56) References Cited

U.S. PATENT DOCUMENTS

2017/0262570 A1*  9/2017  Sakajiri ............... G06F 17/5081
2018/0307792 A1* 10/2018  Kim .................... G03F 7/70433

* cited by examiner

*Primary Examiner* — Paul Dinh
(74) *Attorney, Agent, or Firm* — Tianchen LLC

(57) ABSTRACT

A hotspot correction method is provided. The layout patterns in the hotspot regions are accurately corrected by using an ILT method. Then the layout patterns in the extension regions are corrected by using an OPC method. As a result, the layout patterns in the hotspot regions can be accurately corrected while pattern distortion of the extension regions generated due to the regional ILT correction can be prevented. Moreover, high demanding of calculation capability and long calculation time of global ILT correction can be avoided.

10 Claims, 4 Drawing Sheets

HOTSPOT CORRECTION METHOD

CROSS-REFERENCE TO RELAYED APPLICATION

This application claims the priority benefit of China application serial no. 201710924604.9, filed Sep. 30, 2017. All disclosure of the China application is incorporated herein by reference.

FIELD OF THE INVENTION

The present invention relates to the field of semiconductor manufacturing, and more particularly to a lithographic hotspot correction method.

BACKGROUND OF THE INVENTION

With the continuing decrease of technology node, demands for pattern size precision and overlay accuracy are increasing. However, during the lithographic process, due to the resolution limitation of optical imaging, the right-angled pattern corner in the photomask layout will be inevitably subjected to rounding distortion when exposed and imagined on a silicon wafer. If not being corrected properly, such corner distortion will cause various problems like size reduction of the pattern corner, which will bring adverse effects on the overlay accuracy and the pattern coverage rate. More seriously, such rounding distortion may also convert patterns which conform the design rules and designed to be safe in the layout into hotspots with insufficient process window. In order to avoid the pattern corner distortion, an Optical Proximity Correction (OPC) is generally adopted in the industry to perform photomask correction. The OPC correction method in the prior art mainly includes a rule-based OPC using serif correction and a model-based OPC.

The conventional OPC method comprises the steps of adding assist patterns near the target patterns, performing segmentation to the target patterns, moving the segments of the target patterns according to the difference between their simulation contour and the target patterns until the simulation contour is consistent to the target patterns. However, the size of the segments and the design of the assist patterns mainly depend on experience, which may easily cause hotspots due to the improper segmentation and assist patterns.

In order to improve the OPC correction precision, an inverse lithography technique (ILT) tool called PXOPC is developed. The PXOPC is a target-layer oriented tool which performs photomask optimization through curving the contour of the target patterns, forming photomask pattern with curvy contour from the target patterns, converting the curvy contour of the photomask pattern into a combination of straight lines by a differential method, and adjusting segments of the straight lines. Since the ILT-optimized photomask is generated through curving and re-linearizing, it can automatically optimize the assist patterns and perform proper segmentations, which helps to solve the hotspot problems. Although the PXOPC has the above advantages, the movement and simulation of the curvy contour of the photomask pattern demands enormous calculation capability. For example, the calculation time is four times greater than that of the conventional OPC method with the same number of CPUs, thus global correction cannot be performed.

SUMMARY OF THE INVENTION

Accordingly, at least one objective of the present invention is to provide a hotspot correction method which combines the ILT method and the OPC method.

To achieve these and other advantages and in accordance with the objective of the invention, as embodied and broadly described herein, the invention provides a hotspot correction method comprising the following steps:

S01: marking hotspot regions of a target layer in a layout design; wherein patterns in the hotspot regions are first target patterns;

S02: marking extension regions of the target layer each enclosing a hotspot region in the layout design; wherein patterns in the extension regions are second target patterns; wherein regions outside the extension regions of the target layer are non-correction regions;

S03: providing an original photomask comprising a first photomask pattern corresponding to the first target patterns, and a second photomask pattern corresponding to the second target patterns;

S04: performing inverse lithographic technique to correct the first target patterns using the second photomask pattern as a reference pattern, so as to obtain a corrected first photomask pattern for the hotspot regions;

S05: performing optical proximity correction to correct the second target patterns using the corrected first photomask pattern as a reference pattern, so as to obtain a corrected second photomask pattern for the extension regions;

S06: determining whether the first photomask pattern is the same as the corrected first photomask pattern; if yes, turning to step S07, or else taking the corrected first target patterns as the first target patterns, and taking the corrected second target patterns as the second target patterns, and performing steps S04-S06;

S07: determining whether the second photomask pattern is the same as the corrected second photomask pattern; if yes, turning to an end of the correction for all target patterns of the target layer, or else taking the corrected first target patterns as the first target patterns, and taking the corrected second target patterns as the second target patterns, and performing steps S04-S06.

Furthermore, each hotspot region is a square with a length of 0.2 μm.

Furthermore, each extension region is a square box with an outer side length of 2 μm and an inner side length of 0.2 μm.

Furthermore, the number of the hotspot region is more than one.

Furthermore, the inverse lithographic technique comprises the following steps:

S0401: curving contours of the first target patterns and forming a first hotspot region photomask pattern with curvy contours;

S0402: correcting the first hotspot region photomask pattern with curvy contours to form a second hotspot region photomask pattern with curvy contours;

S0403: linearizing the curvy contours of the second hotspot region photomask pattern into straight lines to form the corrected first photomask pattern.

Furthermore, in step S0401, all of the contours of the first target patterns are curved.

Furthermore, in step S0402, the first hotspot region photomask pattern with curvy contours are corrected according to the comparison between simulation contours of the first hotspot region photomask pattern and the curvy contours of the first target patterns.

Furthermore, in step S0403, the curvy contours of the second hotspot region photomask pattern are linearized into straight lines by a differential method.

Furthermore, in step S0403, the linearized contours of the second hotspot region photomask patterns are segmented and corrected to form the corrected first photomask pattern.

Furthermore, the optical proximity correction is model-based.

According to the present invention, the target patterns within the hotspot regions are accurately corrected by using the ILT method. Furthermore, to improve the distortion of the target patterns within the extension regions due to ILT correction of the hotspot regions, the OPC method is employed thereafter to restore the target patterns within the extension regions. As a result, the target patterns within the hotspot regions can be accurately corrected and pattern distortion generated due to regional ILT correction can be prevented. Moreover, high demanding of calculation capability and long calculation time of global ILT correction can be avoided.

DETAILED DESCRIPTION OF THE EMBODIMENTS

The invention will be described in further details hereinafter with respect to the embodiments and the accompanying drawings of FIG. 1-FIG. 6.

Figure 1:
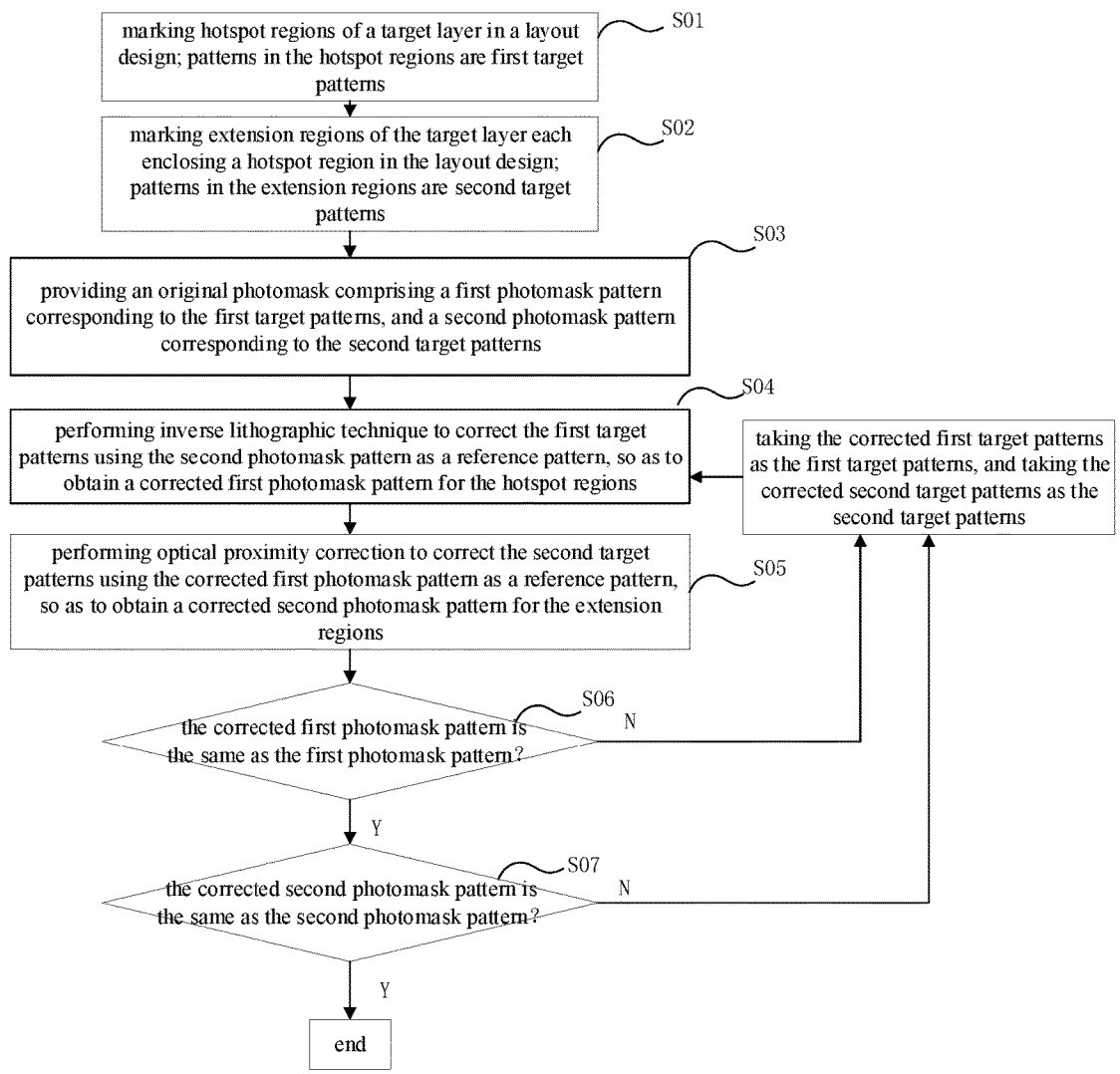
FIG. 1 is a flow chart of a hotspot correction method.

Referring to FIG. 1, the hotspot correction method comprises the following steps:

S01: marking hotspot regions of a target layer in a layout design.

Here, the target layer indicates a layer selected as being a target for correction to be formed on a wafer, such as a wiring layer. As mentioned above, layout patterns which conform the design rules and designed to be safe may be transferred into hotspots with insufficient process window during the actual manufacturing process. Accordingly, in this step, the locations of hotspots of the target layer with insufficient process window are defined in the layout design. The number of the hotspot can be one, or more. When more than one hotspot is defined, the hotspot regions and their extension regions will be corrected at the same time in the following steps.

Figure 2:
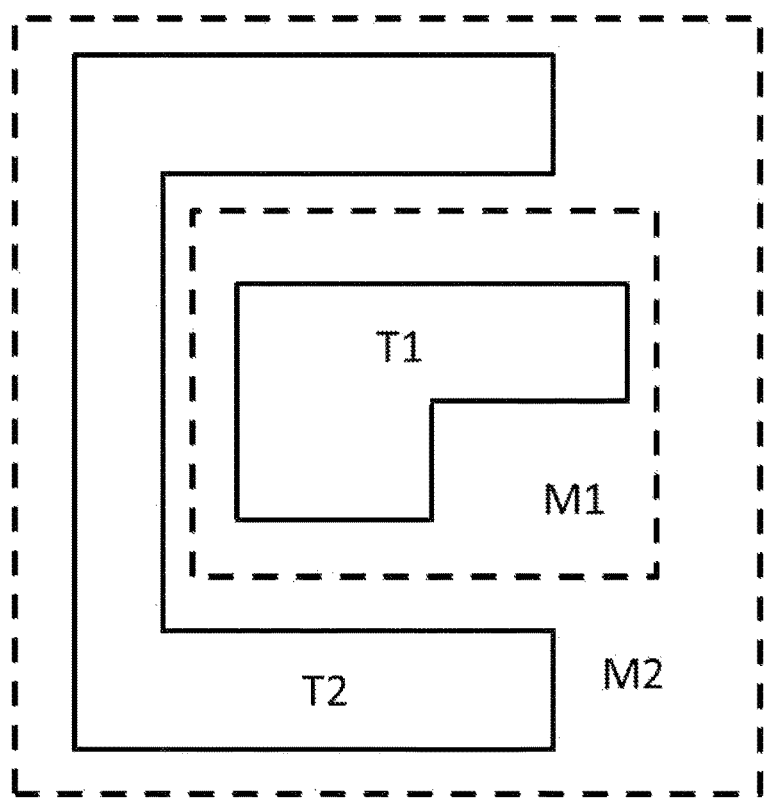
FIG. 2 is a diagram showing the hotspot regions and extension regions of the target layer in the layout design.

After defining the locations of the hotspots, regions each centering on a hotspot are marked as hotspot regions. The range of the marked hotspot regions can be determined according to the target pattern size or other requirements. In the embodiment, each hotspot region is a square having a length of 0.2 μm. The hotspot is located at the center of the square. The patterns within the hotspot regions M1 are first target patterns T1, as shown in FIG. 2.

S02: marking extension regions of the target layer each enclosing a hotspot region in the layout design.

In the step, extension regions are marked each centering on a hotspot and enclosing a hotspot region. Regions outside the extension regions of the target layer in the layout design are non-correction regions. The patterns within the extension regions M2 are second target patterns T2, as shown in FIG. 2.

During the actual manufacturing, the range of the marked extension regions can be determined according to factors like process parameters, target pattern size, etc. In the embodiment, each extension region is a square box centering on a hotspot with an outer side length of 2 μm and an inner side length of 0.2 μm. That is, an extension region is formed by substracting the hotspot region from a square with a length of 2 μm.

S03: providing an original photomask comprising a first photomask pattern corresponding to the first target patterns, a second photomask pattern corresponding to the second target patterns.

In the step, the original photomask is provided. Corresponding to the hotspot regions, extension regions and non-correction regions of the target layer in the layout design, the original photomask can also have three parts including a first photomask pattern for the hotspot region, a second photomask pattern for the extension regions, and a third photomask pattern for the non-correction regions.

Figure 3:
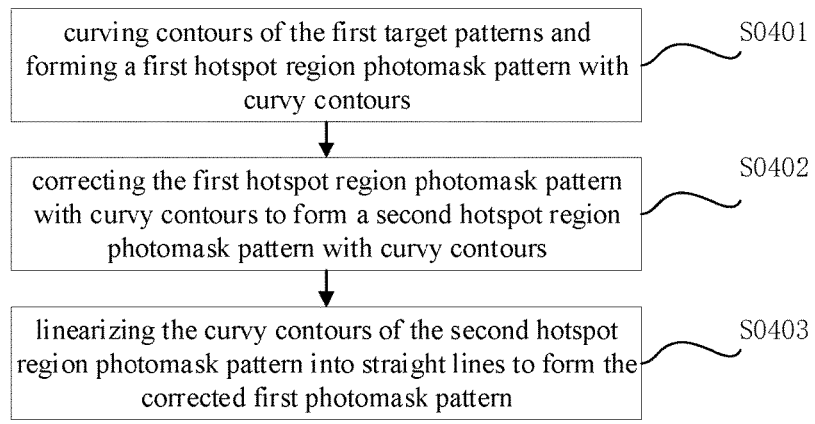
FIG. 3 is a flow chart showing the process steps of performing inverse lithographic technique to correct the first target patterns within the hotspot regions.

S04: performing inverse lithographic technique to correct the first target patterns using the second photomask pattern as a reference pattern, so as to obtain a corrected first photomask pattern for the hotspot regions;

As shown in FIG. 3, the ILT correction comprises the following steps:

S0401: curving contours of the first target patterns M1 and forming a first hotspot region photomask pattern with curvy contours. In this step, the contours of the first target patterns M1 are curved, and a first hotspot region photomask pattern corresponding to the curvy-contoured first target patterns is formed.

S0402: correcting the first hotspot region photomask pattern with curvy contours to form a second hotspot region photomask pattern with curvy contours. Specifically, the simulation contours of the first hotspot region photomask pattern are compared with the curvy contours of the first target patterns, and the first hotspot region photomask pattern is moved according to the difference therebetween. Such comparison and movement are iterated until the contours of the first hotspot region photomask pattern are as similar as possible with the curvy contours of the first target patterns. At this time, the first hotspot region photomask pattern is corrected into the second hotspot region photomask pattern with curvy contours. The number of iterations can be set according to actual requirements. The second hotspot region photomask pattern has similar simulation contours with the curvy-contoured first target patterns.

S0403: linearizing the curvy contours of the second hotspot region photomask pattern into straight lines to form the corrected first photomask pattern.

Figure 4:
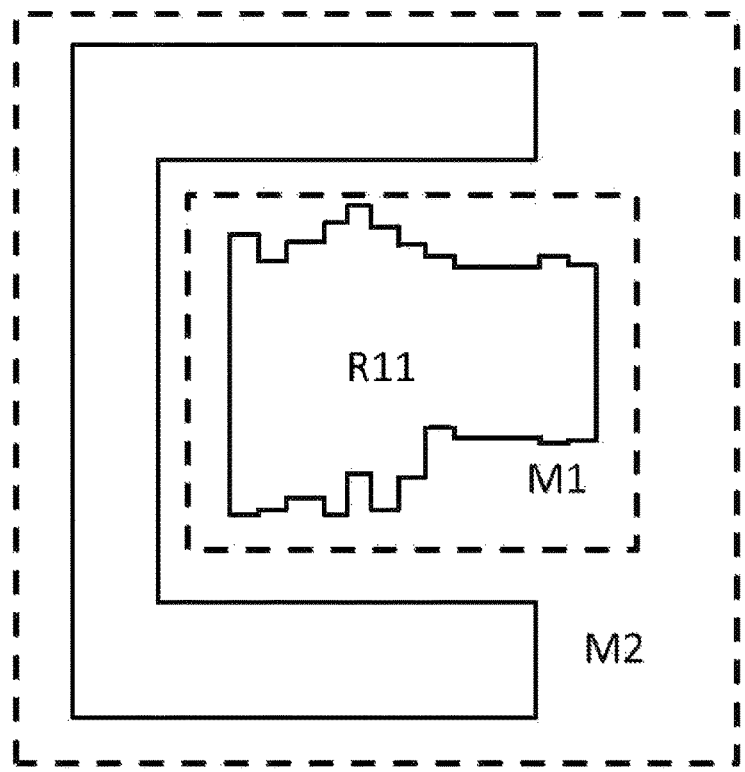
FIG. 4 is a diagram showing the corrected first photomask pattern for the hotspot regions after performing the ILT correction.
Figure 5:
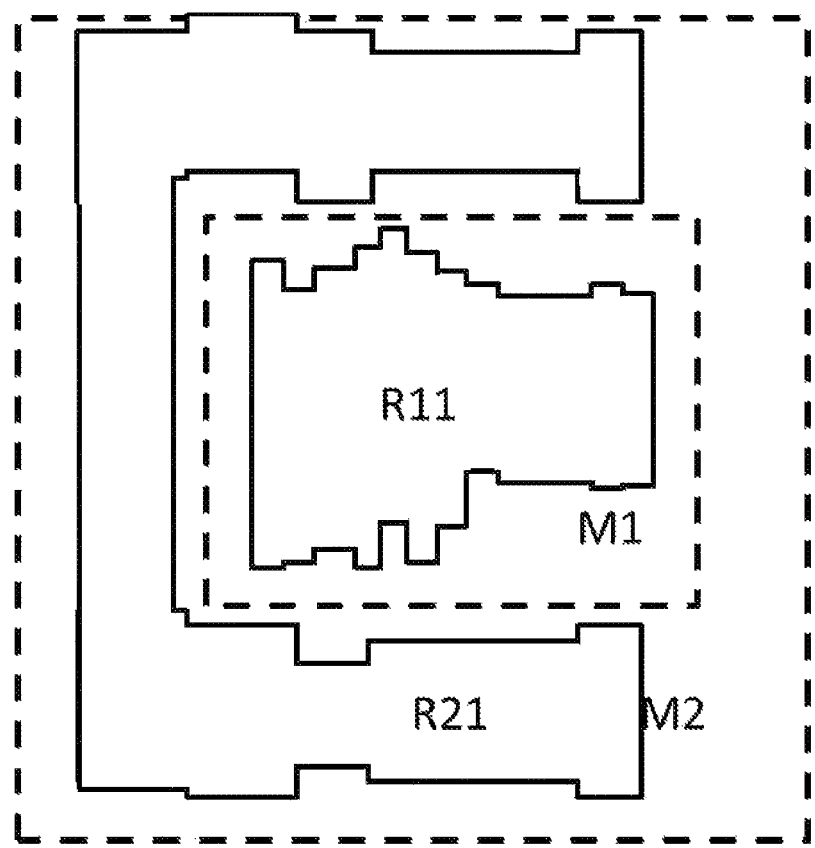
FIG. 5 is a diagram showing the corrected second photomask pattern for the extension regions after performing the OPC correction.

Specifically, the curvy contours of the second hotspot region photomask pattern are linearized into straight lines by a differential method. In the actual manufacturing, the curvy contours can also be converted into straight lines by other means. The restored linear contours can also be simulated and then compared with the contours of the first target patterns. The linear contours may be segmented and moved according to the difference between the simulated linear contours and the contours of the first target patterns. Since the second hotspot region photomask pattern has already been corrected in the same way in step S0402, the adjustment in this step is fine, and the corrected first photomask pattern is formed quickly, as shown in FIG. 4.

From above, firstly, the contours of the first target pattern are curved and a first hotspot region photomask pattern with curvy contours is correspondingly formed. Then the curvy contours of the hotspot region photomask pattern are converted into a combination of straight lines through a differential method. Finally, the straight lines are segmented and adjusted to form the corrected first photomask pattern for the hotspot region. Since such correction comprises contour curving and contour re-linearizing, it can automatically optimize the assist patterns and perform proper segmentations, which helps to solve the hotspot problems. It is noted that, in the embodiment, the inverse lithographic technique can be performed by the ITL tool PXOPC.

S05: performing optical proximity correction to correct the second target patterns using the corrected first photomask pattern as a reference pattern, so as to obtain a corrected second photomask pattern for the extension regions.

During the ITL correction for the hotspot regions, the patterns near the hotspot regions may also be affected. Such distortion of the peripheral patterns may finally influence the simulation result. Accordingly, the target patterns within each extension region enclosing the hotspot region should also be corrected to avoid pattern distortion of these patterns due to ILT correction to the hotspot region patterns.

In the embodiment, the second target pattern within the extension regions are corrected by OPC using the corrected first photomask pattern as a reference pattern. Herein, the OPC can be any conventional OPC method, such as the model-base OPC method, which is not described in detail herein.

S06: determining whether the corrected first photomask pattern is the same as the first photomask pattern; if yes, the correction for patterns in the hotspot regions is completed, the method further turns to step S07; or else, the patterns in the hotspot regions are not completely corrected and should be further corrected. Accordingly, the corrected first target pattern is taken as the first target pattern, and the corrected second target pattern is taken as the second target pattern, and steps S04-S06 are performed again.

S07: determining whether the corrected second photomask pattern is the same as the second photomask pattern; if yes, the correction of the patterns in the extension regions is completed. The accurate correction of the patterns within the hotspot regions can be ensured, at the same time pattern distortion of extension regions due to the ILT correction can be prevented. The method further turns to step S07. If the second corrected photomask pattern is different from the second photomask pattern, it is indicated that pattern distortion of the extension regions is generated during the ILT correction and the patterns in the extension regions should be further corrected. Accordingly, the corrected first target pattern is taken as the first target pattern, and the corrected second target pattern is taken as the second target pattern, and steps S04-S06 are performed again.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A hotspot correction method comprising the following steps:
    S01: marking hotspot regions of a target layer in a layout design; wherein patterns in the hotspot regions are first target patterns;
    S02: marking extension regions of the target layer each enclosing a hotspot region in the layout design; wherein patterns in the extension regions are second target patterns; wherein regions outside the extension regions of the target layer are non-correction regions;
    S03: providing an original photomask comprising a first photomask pattern corresponding to the first target patterns, and a second photomask pattern corresponding to the second target patterns;
    S04: performing inverse lithographic technique to correct the first target patterns using the second photomask pattern as a reference pattern, so as to obtain a corrected first photomask pattern for the hotspot regions;
    S05: performing optical proximity correction to correct the second target patterns using the corrected first photomask pattern as a reference pattern, so as to obtain a corrected second photomask pattern for the extension regions;
    S06: determining whether the first photomask pattern is the same as the corrected first photomask pattern; if yes, turning to step S07, or else taking the corrected first target patterns as the first target patterns, and taking the corrected second target patterns as the second target patterns, and performing steps S04-S06;
    S07: determining whether the second photomask pattern is the same as the corrected second photomask pattern; if yes, turning to an end of the correction for all target patterns of the target layer, or else taking the corrected first target patterns as the first target patterns, and taking the corrected second target patterns as the second target patterns, and performing steps S04-S06.

2. The hotspot correction method according to claim 1, wherein each hotspot region is a square with a length of 0.2 µm.

3. The hotspot correction method according to claim 2, wherein each extension region is a square box with an outer side length of 2 µm and an inner side length of 0.2 µm.

4. The hotspot correction method according to claim 1, wherein the number of the hotspot region is more than one.

5. The hotspot correction method according to claim 1, wherein the inverse lithographic technique comprises the following steps:
    S0401: curving contours of the first target patterns and forming a first hotspot region photomask pattern with curvy contours;
    S0402: correcting the first hotspot region photomask pattern with curvy contours to form a second hotspot region photomask pattern with curvy contours;
    S0403: linearizing the curvy contours of the second hotspot region photomask pattern into straight lines to form the corrected first photomask pattern.

6. The hotspot correction method according to claim 5, wherein in step S0401, all of the contours of the first target patterns are curved.

7. The hotspot correction method according to claim 5, wherein in step S0402, the first hotspot region photomask pattern with curvy contours are corrected according to the comparison between simulation contours of the first hotspot region photomask pattern and the curvy contours of the first target patterns.

8. The hotspot correction method according to claim 5, wherein in step S0403, the curvy contours of the second hotspot region photomask pattern are linearized into straight lines by a differential method.

9. The hotspot correction method according to claim 8, wherein in step S0403, the linearized contours of the second hotspot region photomask patterns are segmented and corrected to form the corrected first photomask pattern.

10. The hotspot correction method according to claim 1, wherein the optical proximity correction is model-based.

\* \* \* \* \*